(12) United States Patent
Hu et al.

(10) Patent No.: US 11,228,008 B2
(45) Date of Patent: Jan. 18, 2022

(54) FLEXIBLE SUBSTRATES AND FLEXIBLE DISPLAY SCREEN

(71) Applicant: Yungu (Gu' an) Technology Co., Ltd., Langfang (CN)

(72) Inventors: Kun Hu, Langfang (CN); Hao Feng, Langfang (CN); Pengle Dang, Langfang (CN); Lu Rao, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 136 days.

(21) Appl. No.: 16/600,576

(22) Filed: Oct. 14, 2019

(65) Prior Publication Data
US 2020/0044171 A1    Feb. 6, 2020

Related U.S. Application Data

(63) Continuation of application No. PCT/CN2018/092445, filed on Jun. 22, 2018.

(30) Foreign Application Priority Data

Nov. 30, 2017    (CN) .......................... 201711242421.5

(51) Int. Cl.
*H01L 51/00* (2006.01)
*G09F 9/30* (2006.01)

(52) U.S. Cl.
CPC .......... *H01L 51/0097* (2013.01); *G09F 9/301* (2013.01); *B32B 2307/51* (2013.01)

(58) Field of Classification Search
CPC . H01L 51/0097; H01L 27/3241; H01L 27/00; G09F 9/301; B32B 2307/51; Y02E 10/549; H05K 3/46; G02F 1/1333
See application file for complete search history.

(56) References Cited

U.S. PATENT DOCUMENTS

| 4,493,313 A * | 1/1985 | Eaton | F24S 40/80 |
| | | | 126/570 |
| 9,029,846 B2 | 5/2015 | Song et al. | |

(Continued)

FOREIGN PATENT DOCUMENTS

| CN | 104241316 A | 12/2014 |
| CN | 104424851 A | 3/2015 |

(Continued)

OTHER PUBLICATIONS

TW Office Action with search report dated Apr. 30, 2019 in the corresponding TW application (application No. 107126491).

(Continued)

*Primary Examiner* — S M Sohel Imtiaz
(74) *Attorney, Agent, or Firm* — Kilpatrick Townsend & Stockton

(57) ABSTRACT

The present disclosure relates to a flexible substrate and a flexible display screen. The flexible substrate includes a first bending zone and a non-bending zone. An elastic modulus of the flexible substrate in the first bending zone is smaller than the elastic modulus in the non-bending zone. When the flexible display screen is bent in the first bending zone, since the elastic modulus of the flexible substrate in the first bending zone is smaller than the elastic modulus in the non-bending zone, such that the neutral layer of the first bending zone moves toward a side away from the flexible substrate, thereby reducing the strain on the display unit located on the side of the first bending area, avoiding the breakage of the metal trace and improving the probability of correct operation of the screen.

17 Claims, 5 Drawing Sheets

(56) References Cited

U.S. PATENT DOCUMENTS

| | | | | |
|---|---|---|---|---|
| 2007/0157527 | A1* | 7/2007 | Wedi | A47K 3/284 52/35 |
| 2014/0092356 | A1* | 4/2014 | Ahn | G02F 1/1339 349/153 |
| 2014/0183473 | A1* | 7/2014 | Lee | G06F 1/1641 257/40 |
| 2014/0295150 | A1* | 10/2014 | Bower | B32B 15/085 428/201 |
| 2014/0339527 | A1* | 11/2014 | Lee | H01L 51/5256 257/40 |
| 2014/0367644 | A1* | 12/2014 | Song | H01L 51/0097 257/40 |
| 2015/0147532 | A1* | 5/2015 | Nam | B32B 3/30 428/172 |
| 2016/0048171 | A1* | 2/2016 | Lee | G06F 1/1652 361/679.27 |
| 2017/0155084 | A1* | 6/2017 | Park | H01L 27/323 |
| 2017/0199547 | A1* | 7/2017 | Jeong | B32B 37/0053 |
| 2017/0373121 | A1* | 12/2017 | Leng | H01L 27/3244 |
| 2019/0140197 | A1* | 5/2019 | Zhao | H01L 51/5256 |
| 2020/0272202 | A1* | 8/2020 | Wang | G06F 1/1652 |

FOREIGN PATENT DOCUMENTS

| | | |
|---|---|---|
| CN | 104680941 A | 6/2015 |
| CN | 104885140 A | 9/2015 |
| CN | 105283311 A | 1/2016 |
| CN | 106328003 A | 1/2017 |
| CN | 106595469 A | 4/2017 |
| CN | 106684115 A | 5/2017 |
| CN | 106847870 A | 6/2017 |
| CN | 106910823 A | 6/2017 |
| CN | 107134538 A | 9/2017 |
| CN | 107230429 A | 10/2017 |
| CN | 107301821 A | 10/2017 |
| CN | 107316881 A | 11/2017 |
| TW | 201322440 A1 | 6/2013 |

OTHER PUBLICATIONS

International Search Report dated Aug. 20, 2018 in the corresponding international application (application No. PCT/CN2018/092445).

* cited by examiner

FLEXIBLE SUBSTRATES AND FLEXIBLE DISPLAY SCREEN

CROSS-REFERENCES TO RELATED APPLICATIONS

This application is a continuation application for International Application PCT/CN2018/092445, filed on Jun. 22, 2018, which claims the priority benefit of Chinese Patent Application No. 201711242421.5, titled "FLEXIBLE SUBSTRATE AND FLEXIBLE DISPLAY SCREEN" and filed on Nov. 30, 2017. The entireties of both applications are incorporated by reference herein for all purposes.

TECHNICAL FIELD

The present disclosure relates to the field of display technology.

BACKGROUND

With the development of display technology, flexible display technology has been more and more widely used. There have been various challenges in designing flexible displays, and new display systems and methods are desired.

SUMMARY

Based on this, in order to solve the problem of poor screen when bending, it is necessary to provide a flexible substrate and a flexible display screen which improve the probability of correct operation of the screen during the bending procedure.

A flexible substrate comprising a first bending zone and a non-bending zone.

An elastic modulus of the first bending zone of the flexible substrate is less than an elastic modulus of the non-bending zone.

In the above flexible substrate, when the flexible display screen is bent in the first bending zone, since the elastic modulus of the flexible substrate in the first bending zone is less than the elastic modulus in the non-bending zone, such that the neutral layer of the first bending zone can be moved toward the side away from the flexible substrate, thereby reducing the strain on the display unit located on the side of the first bending zone, avoiding breakage of the metal track and improving the probability of correct operation of the screen.

In an embodiment, the flexible substrate further includes a second bending zone, and the second bending zone has an elastic modulus less than that of the non-bending zone.

In an embodiment, the flexible substrate includes a display area and a non-display area, the first bending zone is located in the display area or the non-display area, and the second bending zone is located in the display area or the non-display area.

In an embodiment, the first bending zone has a width less than or equal to 3 mm and the second bending zone has a width less than or equal to 2 mm.

In an embodiment, the first bending zone of the flexible substrate is made of a material different from that of the second bending zone.

In an embodiment, a ratio of the elastic modulus of the first bending zone to the elastic modulus of the non-bending zone is between $1:10^6$ and $1:1.5$.

In an embodiment, the first bending zone is made of a material different from that of the non-bending zone.

In an embodiment, the first bending zone of the flexible substrate is provided with a groove in a side surface of the first bending zone facing a display unit, the groove is filled with a first filler, and the first filler has an elastic modulus less than that of the flexible substrate.

In an embodiment, the first filler is made of a material of solid or liquid.

In an embodiment, the material of the first filler includes at least one of the foam, water, and silicone oil.

In an embodiment, the first bending zone is made of a material including at least one of silicone rubber, PDMS, PET, PI, PE, PP, PS and PEN, and the non-bending zone is made of a material including at least one of silicone rubber, PDMS, PET, PI, PE, PP, PS and PEN.

In an embodiment, the flexible substrate includes a first sub-substrate disposed adjacent to the display unit and a second sub-substrate disposed away from the display unit, the first and second sub-substrates are laminated, the first sub-substrate is provided with a filling hole in the first bending zone, the filling hole is filled with a second filler, and the second filler has an elastic modulus smaller than that of the first sub-substrate.

In an embodiment, the number of layers of the flexible substrate is three or more.

In an embodiment, the flexible substrate includes a plurality of bending zones spaced apart one another, and the bending zones include at least the first bending zone and the second bending zone.

In one of the embodiments, the first bending zone of the flexible substrate has a uniform elastic modulus.

In one of the embodiments, the first bending zone of the flexible substrate has a non-uniform elastic modulus.

In an embodiment, the elastic modulus of the first bending zone of the flexible substrate is minimum in the middle of the first bending zone, and gradually increases toward both sides of the first bending zone.

A flexible display screen is also provided, including the flexible substrate described above.

In the flexible display screen of the present disclosure, when the flexible display screen is bent in the first bending zone, since the elastic modulus of the first bending zone of the flexible substrate is less than the elastic modulus of the non-bending zone, such that the neutral layer of the first bending zone moves toward the side away from the flexible substrate, thereby reducing the strain on the display unit located on the side of the first bending zone, and improving the probability of correct operation of the screen.

DETAILED DESCRIPTION OF THE INVENTION

In the process of bending the traditional flexible display screen, the bending zone is subjected to stress. When the strain on the device in the bending zone exceeds its own critical strain, the fracture failure of the device may occur, thereby causing the electrical failure of the display screen, resulting in poor screen.

In order to make the above-mentioned objects, features and advantages of the present disclosure more apparent, the specific embodiments of the present application are described in detail below with reference to the accompanying drawings. Numerous specific details are set forth in the description below in order to provide a thorough understanding of the disclosure. However, the present disclosure can be implemented in many other ways than those described herein, and those skilled in the art can make similar modifications without departing from the scope of the present disclosure, and thus the present disclosure is not limited by the specific embodiments disclosed below.

Figure 1:
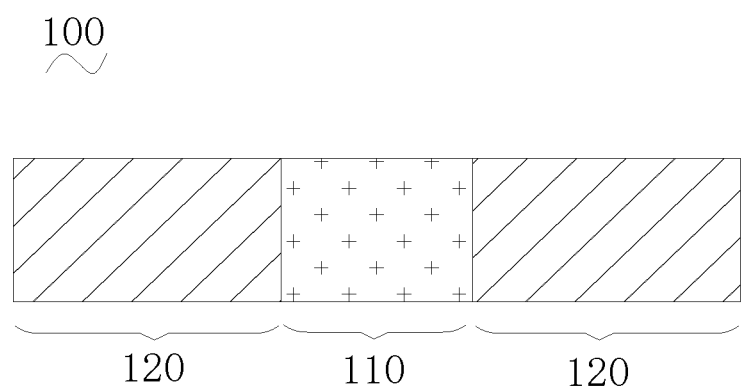
FIG. 1 is a schematic diagram illustrating a flexible substrate according to a first embodiment.

A flexible display includes a flexible substrate and a display unit disposed on the flexible substrate. Referring to FIG. 1, in the first embodiment, the flexible substrate 100 includes a first bending zone 110 and a non-bending zone 120. The elastic modulus of the flexible substrate 100 in the first bending zone 110 is smaller than the elastic modulus thereof in the non-bending zone 120.

The first bending zone 110 may be located in a display area or a non-display area of the flexible substrate 100. When the first bending zone 110 is located in the non-display area of the flexible substrate 100, the first bending zone 110 includes, but is not limited to, a peripheral metal track for transmitting signals.

Similarly, the non-bending zone 120 can be located in the display or non-display area of the flexible substrate 100.

In the present embodiment, in the flexible substrate 100, a material in the first bending zone 110 is same to a material of the flexible substrate 100 in the non-bending zone 120. The process conditions can be controlled during manufacturing the flexible substrate 100, to make the elastic modulus of the flexible substrate 100 in the first bending zone 110 be smaller than the elastic modulus of the flexible substrate 100 in the non-bending zone 120.

After a display unit is formed on the flexible substrate 100, there is a neutral layer, which is unstressed, disposed on a flexible display screen. A part of the neutral layer in the non-bending zone 120 is adjacent to a bottom surface of the flexible substrate 100, while another part of the neutral layer in the first bending zone 110 is away from a bottom surface of the flexible substrate 100. When the flexible display screen is bent at the first bending zone 110, the strain force on the display unit located on the first bending zone 110 is reduced, thereby improving the probability of correct operation of the screen.

The ratio of the elastic modulus of the first bending zone 110 to the elastic modulus of the non-bending zone 120 is between $1:10^6$ and $1:1.5$, which can bring the neutral layer closer to the top of the display unit, reducing the strain force on the flexible display screen, thereby improving the mechanical reliability of the flexible display screen.

The material of the first bending zone 110 is different from the material of the non-bending zone 120. At this time, since the elastic modulus of the material of the first bending zone 110 is smaller than the elastic modulus of the material of the non-bending zone 120, when bending, the strain force on the display unit located on the first bending zone 110 is reduced, thereby improving the probability of correct operation of the screen.

Preferably, the material of the first bending zone 110 is selected from at least one of silicone rubber, polydimethylsiloxane (PDMS), polyethylene terephthalate (PET), polyimide (PI), polyethylene (PE), polypropylene (PP), polystyrene (PS) and polyethylene naphthalate (PEN). The material of the bending zone 120 is selected from at least one of silicone rubber, PDMS, PET, PI, PE, PP, PS and PEN.

Figure 2:
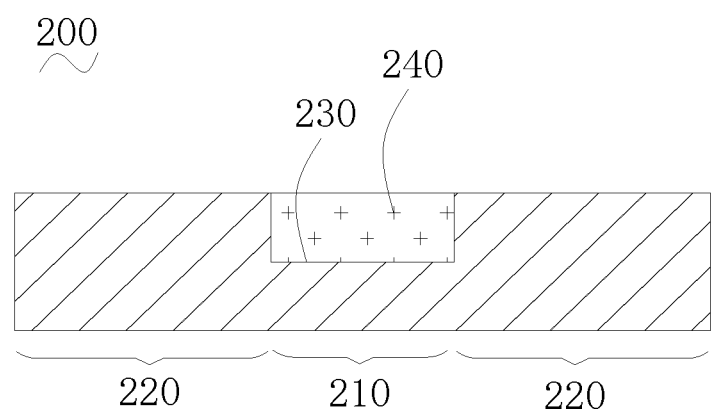
FIG. 2 is a schematic diagram illustrating a flexible substrate according to a second embodiment.

Referring to FIG. 2, the flexible substrate 200 of the second embodiment includes a first bending zone 210 and a non-bending zone 220. The elastic modulus of the flexible substrate 200 in the first bending zone 210 is smaller than the elastic modulus of the flexible substrate 200 in the non-bending zone 220.

At least a groove 230 is disposed on a side surface of the first bending zone 210 facing to the display unit. The groove 230 is filled with a first filler 240. The elastic modulus of the first filler 240 is smaller than the elastic modulus of the flexible substrate 200.

The first filler 240 may be a solid filler or a liquid filler. Preferably, the first filler 240 is selected from at least one of foam, water and silicone oil.

It should be noted that in the flexible substrate 200 according to the present embodiment, the width of the groove 230 is equal to the width of the first bending zone 210. However, it is not limited thereto, and the width of the groove 230 may be larger or smaller than the width of the first bending zone 210. Optionally, the first bending zone 210 may not define any groove.

It should be noted that the number of layers of the flexible substrate of the present disclosure is not limited to one layer according to the first embodiment and the second embodiment.

Figure 3:
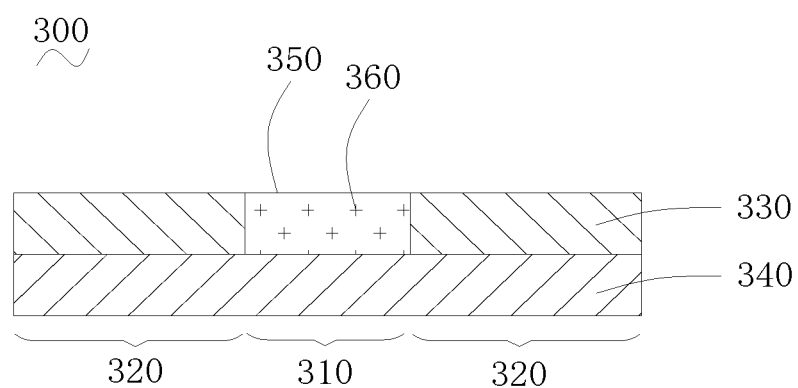
FIG. 3 is a schematic diagram illustrating a flexible substrate according to a third embodiment.

Referring to FIG. 3, the flexible substrate 300 according to the third embodiment includes a first bending zone 310 and a non-bending zone 320. The elastic modulus of the flexible substrate 300 in the first bending zone 310 is smaller than the elastic modulus of the flexible substrate 300 in the non-bending zone 320.

Specifically, the flexible substrate 300 of the present embodiment includes a first sub-substrate 330 disposed adjacent to the display unit and a second sub-substrate 340 disposed away from the display unit.

The first sub-substrate 330 is provided with a filling hole 350 extending through the first sub-substrate 330 in the bending zone. The filling hole 350 is filled with a second filler 360. The elastic modulus of the second filler 360 is smaller than the elastic modulus of the first sub-substrate 330. The material of the second filler 360 is selected from the material of the first filler 240 in the flexible substrate 300 according to the second embodiment.

In the present embodiment, the materials of the first sub-substrate 330 and the second sub-substrate 340 are different. Optionally, the materials of the first sub-substrate 330 and the second sub-substrate 340 may also be the same.

In addition, it should be noted that the flexible substrate of the present disclosure is a layer structure and includes at least three layers. The flexible substrate in each of the above embodiments includes only one bending zone, but it is not limited thereto, and the flexible substrate may further include a plurality of spaced apart bending zones.

Figure 4:
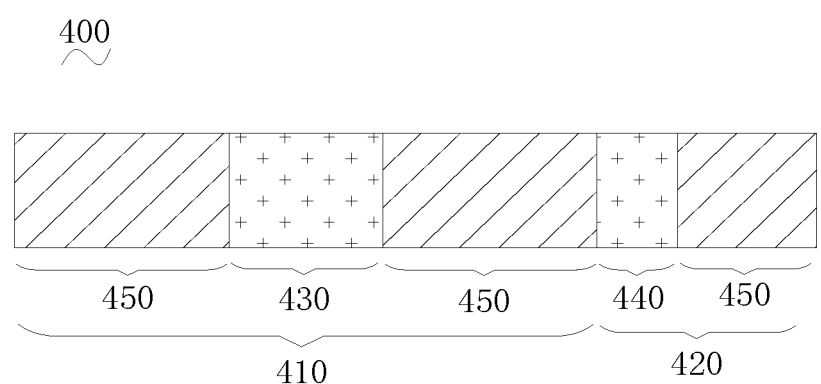
FIG. 4 is a schematic diagram illustrating a flexible substrate according to a fourth embodiment.

Referring to FIG. 4, the flexible substrate 400 of the fourth embodiment includes a display area (AA area) 410 and a non-display area (non-AA area) 420. And the flexible substrate 400 includes a first bending zone 430, a second bending zone 440, and a non-bending zone 450. The first bending zone 430 is located within the display area 410. The second bending zone 440 is located within the non-display zone 420.

The elastic modulus of the flexible substrate 400 in the first bending zone 430 is smaller than the elastic modulus of the flexible substrate 400 in the non-bending zone 450. The elastic modulus of the flexible substrate 400 in the second bending zone 440 is smaller than the elastic modulus of the non-bending zone 450. In the flexible substrate 400 of the present embodiment, the elastic modulus is distributed in sections.

Specifically, the materials of the flexible substrate 400 in the first bending zone 430, in the second bending zone 440, and in the non-bending zone 450 are the same. The process conditions may be controlled during the manufacturing process to make the elastic modulus of the flexible substrate 400 in the first bending zone 430 be smaller than the elastic modulus of the flexible substrate 400 in the non-bending zone 450, and the elastic modulus of the flexible substrate 400 in the second bending zone 440 be smaller than the elastic modulus of the non-bending zone 450.

In the embodiment, the process employed in the first bending zone 430 and the second bending zone 440 by the flexible substrate 400 are the same. In other embodiments, different manufacturing processes may be employed so that the flexible substrate 400 includes different elastic modulus in the first bending zone 430 and the second bending zone 440.

Preferably, the width of the first bending zone 430 is less than or equal to 3 mm, and the width of the second bending zone 440 is less than or equal to 2 mm, which can improve the multiple bending resistance of the first bending zone 430 and the second bending zone 440, and can achieve the small radius bend of the second bend zone 440 on the non-AA zone.

In addition, the material of the flexible substrate of the present disclosure in the first bending zone and the material of the flexible substrate in the second bending zone may be different. In other embodiments, the materials of the first bending zone, the second bending zone and the non-bending zone are different.

For example, the first bending zone 430 of the AA zone 410 can also employ the bending zones referred in the second embodiment and in the third embodiment. Similarly, the second bending zone 440 of the non-AA zone 420 can also employ the bending zones referred in the second embodiment and in the third embodiment.

In addition, in the flexible substrate of the present disclosure, the elastic modulus of the flexible substrate in the bending zone may be uniform, that is, the elastic modulus of each portion of the bending zone is the same, or may be non-uniform, and may be distributed according to a certain rule. For example, it is also possible to set the elastic modulus to be minimum in a middle of the first bending zone, and gradually increases toward both sides of the first bending zone.

In the above flexible substrate, when the flexible display screen is bent in the first bending zone, since the elastic modulus of the flexible substrate in the first bending zone is smaller than the elastic modulus of the flexible substrate in the non-bending zone, such that the neutral layer of the first bending zone can be moved toward the side away from the flexible substrate, thereby reducing the strain force on the display unit located on the side of the first bending zone, and improving the probability of correct operation of the screen.

Figure 5:
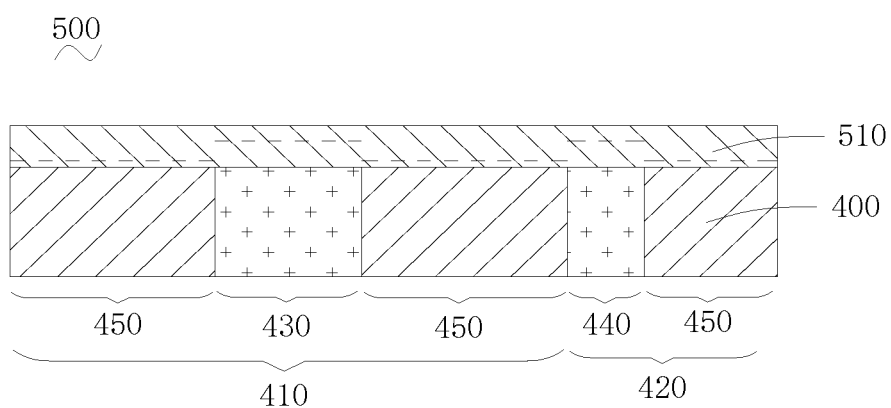
FIG. 5 is a schematic diagram illustrating a flexible display screen according to an embodiment.

Referring to FIG. 5, a flexible display screen 500 of an embodiment includes a flexible substrate 400 referred in the fourth embodiment and a display unit 510 formed on the flexible substrate 400.

The material of the flexible substrate 400 of the present embodiment is PI. The flexible substrate 400 has a thickness of 20 μm. The elastic modulus of the flexible substrate 400 in the non-bending zone 450 is 7.9 GPa, and the elastic modulus of the flexible substrate 400 in the first bending zone 430 and in the second bending zone 440 are both 4 GPa.

The display unit 510 of the present embodiment has a thickness of 6 μm and an elastic modulus of 200 GPa.

Using the following formula to conduct the theoretical calculation:

$$b = \sum_{i=1}^{2} E_i t_i \left[ \sum_{j=1}^{i} t_j - \frac{1}{2} t_i \right] / \sum_{i=1}^{2} E_i t_i$$

Where E is the elastic modulus, t is the thickness, and b is the distance from the neutral layer to the bottom end.

The neutral layer of the non-bending area 450 is located at a position (marked by the dotted line in FIG. 5) which is 21.47 μm from the bottom end of the flexible substrate 400, and the tensile strain at the top end of the flexible display screen is 0.15%. The neutral layer of the first bending zone 430 and the second bending zone 440 is located at a position which is 22.19 μm from the bottom end of the flexible substrate 400, and the tensile strain at the top end of the flexible display screen is 0.12%.

It can be seen from the above calculation results that by reducing the elastic modulus of the flexible substrate 400 in the first bending zone 430 and the second bending zone 440, the neutral layer of the flexible display screen can be brought closer to the top layer of the flexible display screen, effectively improving the bending resistance reliability of the flexible display.

The structure of the flexible display screen of the present disclosure is not limited thereto, and the flexible substrate may also be the flexible substrate in each of the above embodiments.

In the flexible display screen of the present disclosure, when the flexible display screen is bent in the first bending zone, since the elastic modulus of the flexible substrate in the first bending zone is smaller than the elastic modulus of the flexible substrate in the non-bending zone, such that the neutral layer of the first bending zone moves toward the side away from the flexible substrate, thereby reducing the strain on the display unit located on the side of the first bending zone, avoiding breakage of the metal track and improving the probability of correct operation of the screen.

The technical features of the above-described embodiments may be arbitrarily combined. For the sake of brevity of description, all possible combinations of the technical features in the above embodiments are not described. However, as long as there is no contradiction between the combinations of these technical features, all should be considered as the scope of this specification.

The above-mentioned embodiments are merely illustrative of several embodiments of the present disclosure, and the description thereof is more specific and detailed, but is not to be construed as limiting the scope of the claims. It should be noted that a number of variations and modifications may be made by those skilled in the art without departing from the spirit and scope of the present disclosure. Therefore, the scope of protection of the disclosure should be determined by the appended claims.

The invention claimed is:

1. A flexible substrate, comprising a first bending zone and a non-bending zone;

wherein the first bending zone of the flexible substrate is characterized by an elastic modulus less than that of the non-bending zone;

wherein the first bending zone of the flexible substrate has a non-uniform elastic modulus; and wherein the elastic modulus of the first bending zone of the flexible substrate is minimum in a middle of the first bending zone, and gradually increases toward both sides of the first bending zone.

2. The flexible substrate according to claim 1, wherein the flexible substrate further comprises a second bending zone, and the second bending zone has an elastic modulus smaller than that of the non-bending zone.

3. The flexible substrate according to claim 2, wherein the flexible substrate comprises a display area and a non-display area, the first bending zone is located in the display area or the non-display area, and the second bending zone is located in the display area or the non-display area.

4. The flexible substrate according to claim 2, wherein the first bending zone has a width smaller than or equal to 3 mm and the second bending zone has a width smaller than or equal to 2 mm.

5. The flexible substrate according to claim 2, wherein the first bending zone of the flexible substrate is made of a material different from that of the second bending zone.

6. The flexible substrate according to claim 1, wherein a ratio of the elastic modulus of the first bending zone to the elastic modulus of the non-bending zone is between $1:1^6$ and $1:1.5$.

7. The flexible substrate according to claim 1, wherein the first bending zone is made of a material different from that of the non-bending zone.

8. The flexible substrate according to claim 1, wherein the first bending zone of the flexible substrate is provided with a groove in a side surface of the first bending zone facing to a display unit, the groove being filled with a first filler, and the first filler having an elastic modulus smaller than that of the flexible substrate.

9. The flexible substrate according to claim 8, wherein the first filler is made of a material of solid or liquid.

10. The flexible substrate according to claim 9, wherein the material of the first filler comprises at least one of foam, water and silicone oil.

11. The flexible substrate according to claim 1, wherein the first bending zone is made of a material comprising at least one of silicone rubber, polydimethylsiloxane (PDMS), polyethylene terephthalate (PET), polyimide (PI), polyethylene (PE), polypropylene (PP), polystyrene (PS) and polyethylene naphthalate (PEN), and the non-bending zone is made of a material comprising at least one of silicone rubber, PDMS, PET, PI, PE, PP, PS and PEN.

12. The flexible substrate according to claim 1, wherein the flexible substrate comprises a first sub-substrate disposed adjacent to a display unit and a second sub-substrate disposed away from the display unit, the first and second sub-substrates being stacked, the first sub-substrate being provided with a filling hole extending through the first bending zone, the filling hole being filled with a second filler, and the second filler having an elastic modulus smaller than that of the first sub-substrate.

13. The flexible substrate according to claim 1, wherein the flexible substrate is layer structure comprising at least three layers.

14. The flexible substrate according to claim 2, wherein the flexible substrate comprises a plurality of bending zones spaced apart from one another, the bending zones including at least the first bending zone and the second bending zone.

15. A flexible display comprising a flexible substrate, the flexible substrate comprising a first bending zone and a non-bending zone;

wherein the first bending zone of the flexible substrate is characterized by an elastic modulus less than that of the non-bending zone; and wherein the elastic modulus of the first bending zone of the flexible substrate is minimum in a middle of the first bending zone, and gradually increases toward both sides of the first bending zone.

16. A flexible display, comprising:

a flexible substrate, comprising a first bending zone and a non-bending zone; and a display unit configured on the flexible substrate, the display unit comprising a neutral layer;

wherein the first bending zone of the flexible substrate is characterized by a first elastic modulus, the non-bending zone is characterized by a second elastic modulus, the first elastic modulus is less than the second elastic modulus;

wherein a first part of the neutral layer in the non-bending zone is adjacent to a bottom surface of the flexible substrate, a second part of the neutral layer in the first bending zone is away from a bottom surface of the flexible substrate;

wherein the first bending zone of the flexible substrate has a non-uniform elastic modulus; and wherein the elastic modulus of the first bending zone of the flexible substrate is minimum in a middle of the first bending zone, and gradually increases toward both sides of the first bending zone.

17. The flexible display according to claim 16, wherein the first bending zone of the flexible substrate is provided with a groove in a side surface of the first bending zone facing to a display unit, a width of the groove is greater than a width of the first bending zone.

\* \* \* \* \*